US012805088B2

(12) United States Patent
Hsu et al.

(10) Patent No.: US 12,805,088 B2
(45) Date of Patent: Nov. 17, 2026

(54) DISPLAY PANEL, TILED DISPLAY DEVICE INCLUDING THE SAME, AND MANUFACTURING METHOD THEREOF

(71) Applicant: AUO Corporation, Hsinchu (TW)

(72) Inventors: Yi-Yueh Hsu, Hsinchu (TW); Kuan-Hsun Chen, Hsinchu (TW); Sheng-Chin Wang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 355 days.

(21) Appl. No.: 18/536,238

(22) Filed: Dec. 12, 2023

(65) Prior Publication Data

US 2024/0313181 A1 Sep. 19, 2024

(30) Foreign Application Priority Data

Mar. 17, 2023 (TW) ................................ 112109993

(51) Int. Cl.
*H10H 20/857* (2025.01)
*H10H 20/853* (2025.01)
(Continued)

(52) U.S. Cl.
CPC ........ *H10H 20/857* (2025.01); *H10H 20/853* (2025.01); *H10H 20/855* (2025.01);
(Continued)

(58) Field of Classification Search
CPC .. H10H 20/857; H10H 20/853; H10H 20/855; H10H 29/142; H10H 20/0362;
(Continued)

(56) References Cited

U.S. PATENT DOCUMENTS 7,923,298 B2 * 4/2011 Oliver .................... H10F 39/804 438/114
8,581,287 B2 * 11/2013 Waragaya ............ H10H 20/856 438/45
(Continued)

FOREIGN PATENT DOCUMENTS

CN 107968142 A * 4/2018 ............ H10W 90/00
CN 104282819 B * 8/2018 ............ H10W 90/00
(Continued)

*Primary Examiner* — Mohammed Shamsuzzaman
(74) *Attorney, Agent, or Firm* — JCIPRNET

(57) ABSTRACT

A display panel having a display region and a lead out wiring region adjacent to each other is provided. The display panel includes a circuit substrate, light-emitting elements disposed at the display region and located on the circuit substrate, an encapsulation layer, and a sealing layer. The circuit substrate has opposite top and bottom surfaces and a first side surface connecting the top and bottom surfaces and extending from the display region to the lead out wiring region. The encapsulation layer is disposed at the display region and located between the circuit substrate and the light-emitting elements, where a first terminal surface of the encapsulation layer is aligned with the first side surface of the circuit substrate. The sealing layer covers the first side surface and the first terminal surface. A tiled display device including the above-mentioned display panel and a manufacturing method of the display panel are also provided.

18 Claims, 20 Drawing Sheets

(51) Int. Cl.

| | |
|---|---|
| ***H10H 20/855*** | (2025.01) |
| ***H10H 29/14*** | (2025.01) |
| ***H10W 90/00*** | (2026.01) |
| *H10H 20/01* | (2025.01) |

(52) U.S. Cl.
CPC .......... *H10H 29/142* (2025.01); *H10W 90/00* (2026.01); *H10H 20/0362* (2025.01); *H10H 20/0363* (2025.01)

(58) Field of Classification Search
CPC ..... H10H 20/0363; H10W 90/00; G09F 9/33; G09F 9/3026; H10D 86/0212; H10D 86/411; H10D 86/441
See application file for complete search history.

(56) References Cited

U.S. PATENT DOCUMENTS

| | | | | |
|---|---|---|---|---|
| 8,928,021 | B1 * | 1/2015 | Bibl | H10W 72/851 257/E33.072 |
| 10,388,838 | B2 * | 8/2019 | Hung | H10H 20/854 |
| 10,896,897 | B2 * | 1/2021 | Shao | H10W 90/00 |
| 12,207,515 | B2 | 1/2025 | Yoo et al. | |
| 2007/0170855 | A1 * | 7/2007 | Choi | H10K 50/86 313/512 |
| 2009/0068798 | A1 * | 3/2009 | Oliver | H10F 39/804 438/127 |
| 2011/0309388 | A1 * | 12/2011 | Ito | H10H 20/856 257/89 |
| 2013/0335975 | A1 * | 12/2013 | Park | F21S 41/20 257/79 |
| 2014/0091348 | A1 * | 4/2014 | Katayama | B32B 3/08 438/26 |
| 2014/0131753 | A1 * | 5/2014 | Ishida | H10H 20/856 257/98 |
| 2015/0008462 | A1 * | 1/2015 | Weng | H10H 20/853 438/27 |
| 2015/0188004 | A1 * | 7/2015 | Ozeki | H10H 20/8515 438/27 |
| 2017/0025588 | A1 * | 1/2017 | Weng | H10H 20/853 |
| 2017/0358604 | A1 * | 12/2017 | Lee | H10D 86/451 |
| 2018/0122996 | A1 * | 5/2018 | He | H10H 20/8506 |
| 2020/0235186 | A1 * | 7/2020 | Jung | G06F 3/0412 |
| 2020/0310180 | A1 * | 10/2020 | Fu | G02F 1/13439 |
| 2020/0312819 | A1 * | 10/2020 | Shao | H10W 90/00 |
| 2022/0208951 | A1 | 6/2022 | Yoo et al. | |
| 2023/0187417 | A1 * | 6/2023 | Chan | H10W 90/00 257/91 |
| 2023/0246142 | A1 * | 8/2023 | Chan | H10H 20/853 257/88 |
| 2023/0261147 | A1 | 8/2023 | Hsu et al. | |
| 2024/0379629 | A1 * | 11/2024 | Wang | H10H 20/855 |
| 2025/0221260 | A1 * | 7/2025 | Heo | H10K 59/124 |

FOREIGN PATENT DOCUMENTS

| | | | | | |
|---|---|---|---|---|---|
| CN | 107210342 | B | * | 1/2019 | H10W 90/00 |
| CN | 114613799 | | | 6/2022 | |
| CN | 114843300 | | | 8/2022 | |
| CN | 114883472 | | | 8/2022 | |
| CN | 114899181 | | | 8/2022 | |
| CN | 115132716 | | | 9/2022 | |
| CN | 115548066 | A | * | 12/2022 | G06F 3/0446 |
| CN | 114388679 | B | * | 5/2023 | H10H 29/14 |
| CN | 117198162 | A | * | 12/2023 | H10W 90/00 |
| EP | 3125310 | A1 | * | 2/2017 | H10H 20/85 |
| GB | 2417599 | B | * | 10/2006 | H01L 51/524 |
| JP | 5326705 | B2 | * | 10/2013 | H10W 90/00 |
| JP | 2016000831 | A | * | 1/2016 | H10W 90/00 |
| JP | 6411685 | B1 | * | 10/2018 | H10W 90/00 |
| KR | 20190046684 | | | 5/2019 | |
| KR | 20220096888 | | | 7/2022 | |
| TW | I667643 | B | * | 8/2019 | H10W 90/00 |
| TW | 202245245 | | | 11/2022 | |
| TW | 202446241 | A | * | 11/2024 | H10W 90/00 |

* cited by examiner

DISPLAY PANEL, TILED DISPLAY DEVICE INCLUDING THE SAME, AND MANUFACTURING METHOD THEREOF

CROSS-REFERENCE TO RELATED APPLICATION

This application claims the priority benefit of Taiwan application serial no. 112109993, filed on Mar. 17, 2023. The entirety of the above-mentioned patent application is hereby incorporated by reference herein and made a part of this specification.

BACKGROUND

Technical Field

The disclosure relates to a photoelectric device and a manufacturing method thereof; more particularly, the disclosure relates to a display panel, a tiled display device including the display panel, and a manufacturing method of the display panel.

Description of Related Art

Micro light-emitting diode (micro-LED) display devices possess advantages including power conservation, high efficiency, elevated brightness, and rapid response time. Given the small dimensions of the micro-LEDs, the prevailing methodology for manufacturing the micro-LED display devices involves the utilization of a mass transfer technology; that is, a micro-electromechanical array technology is applied to pick up and place micro-LED chips, facilitating the simultaneous transfer of a substantial quantity of the micro-LED chips onto a circuit substrate.

Nevertheless, owing to the ongoing necessity for enhancing the yield of the mass transfer technology, the prevailing approach involves the initial fabrication of small display panels and subsequent action of tiling the panels to form a large display device. To achieve a seamless tiling configuration, the entire display surface of the individual panels is considered an effective region, which leads to a stringent requirement for high thickness uniformity in an encapsulation layer of the display panel and thus poses a significant challenge to the encapsulation process. Moreover, the encapsulation structure has a multi-layer design, and after undergoing high temperature and high humidity reliability tests, peeling often occurs between layers and may even adversely impact circuit connections, thereby compromising overall reliability.

SUMMARY

The disclosure provides a display panel with an improved reliability.

The disclosure provides a tiled display device with an improved reliability.

The disclosure provides a manufacturing method of a display panel that can improve thickness uniformity of an encapsulation layer in the display panel.

An embodiment of the disclosure provides a display panel, and the display panel has a display region and a lead out wiring region adjacent to the display region and includes a circuit substrate, a plurality of light-emitting elements, an encapsulation layer, and a sealing layer. The circuit substrate has a top surface, a bottom surface opposite to the top surface, and a first side surface connecting the top surface and the bottom surface, where the first side surface extends from the display region to the lead out wiring region. The light-emitting elements are disposed at the display region and located on the circuit substrate. The encapsulation layer is disposed at the display region and located between the circuit substrate and the light-emitting elements, where a first terminal surface of the encapsulation layer is aligned with a first side surface of the circuit substrate. The sealing layer covers the first side surface of the circuit substrate and the first terminal surface of the encapsulation layer.

In an embodiment of the disclosure, a height of the encapsulation layer is less than or equal to a height of the light-emitting elements.

In an embodiment of the disclosure, a thickness of the encapsulation layer is 5 μm to 10 μm, an optical density (OD) value of the encapsulation layer is greater than or equal to 3, and an OD value of the sealing layer is greater than or equal to 2.

In an embodiment of the disclosure, a height of the encapsulation layer is greater than a height of the light-emitting elements.

In an embodiment of the disclosure, a transmittance of the encapsulation layer is greater than or equal to 80%, and a transmittance of the sealing layer is greater than or equal to 80%.

In an embodiment of the disclosure, the sealing layer extends from one portion of the first side surface of the circuit substrate located in the display region to the other portion of the first side surface of the circuit substrate located in the lead out wiring region.

In an embodiment of the disclosure, the display panel further includes a chip bonding film disposed at the lead out wiring region and electrically connected to the circuit substrate.

In an embodiment of the disclosure, the display panel further includes a protection adhesive located at the lead out wiring region and covering the chip bonding film.

In an embodiment of the disclosure, a material of the protection adhesive is different from a material of the encapsulation layer.

In an embodiment of the disclosure, the protection adhesive covers a second side surface of the circuit substrate located in the lead out wiring region, and the second side surface adjoins the first side surface of the circuit substrate.

In an embodiment of the disclosure, a second terminal surface of the encapsulation layer is located between the light-emitting elements and the second side surface.

In an embodiment of the disclosure, the chip bonding film is located between the second terminal surface and the second side surface.

In an embodiment of the disclosure, the display panel further includes an optical layer disposed at the display region and located on the light-emitting elements and the encapsulation layer.

In an embodiment of the disclosure, a first edge surface of the optical layer extends beyond the first terminal surface of the encapsulation layer, and the sealing layer physically contacts the encapsulation layer and the optical layer.

In an embodiment of the disclosure, a cutting mark on the first edge surface of the optical layer continuously extends to a cutting surface of the sealing layer.

In an embodiment of the disclosure, a top surface of the encapsulation layer is aligned with a top surface of the sealing layer.

In an embodiment of the disclosure, a first edge surface of the optical layer is aligned with the first terminal surface of the encapsulation layer, and the sealing layer further covers the first edge surface of the optical layer.

Another embodiment of the disclosure provides a tiled display device that includes two of the above-mentioned display panels.

In an embodiment of the disclosure, the first side surfaces of the circuit substrates of the two display panels are opposite to each other.

In an embodiment of the disclosure, the sealing layers are located between the two display panels.

Another embodiment of the disclosure provides a manufacturing method of a display panel, and the method includes following steps. A circuit substrate is provided. A plurality of light-emitting elements are disposed on the circuit substrate. An encapsulation layer is formed on the circuit substrate and the light-emitting elements. The circuit substrate and the encapsulation layer are cut to expose a first side surface of the circuit substrate and a first terminal surface of the encapsulation layer. A sealing layer is formed on the first side surface of the circuit substrate and the first terminal surface of the encapsulation layer.

In an embodiment of the disclosure, the manufacturing method further includes performing a planarization process on the encapsulation layer after forming the encapsulation layer on the circuit substrate and the light-emitting elements.

In an embodiment of the disclosure, the manufacturing method further includes forming an optical layer on the encapsulation layer and the light-emitting elements after cutting the circuit substrate and the encapsulation layer.

In an embodiment of the disclosure, the sealing layer is further formed on a bottom surface of the optical layer.

In an embodiment of the disclosure, the manufacturing method further includes cutting the optical layer and the sealing layer after forming the sealing layer, so as to expose a first edge surface of the optical layer and a cutting surface of the sealing layer.

In an embodiment of the disclosure, a cutting mark on the first edge surface of the optical layer continuously extends to the cutting surface of the sealing layer.

In an embodiment of the disclosure, the manufacturing method further includes forming an optical layer on the encapsulation layer and the light-emitting elements before cutting the circuit substrate and the encapsulation layer, and the step of cutting the circuit substrate and the encapsulation layer further includes cutting the optical layer, so as to expose a first edge surface of the optical layer.

In an embodiment of the disclosure, the sealing layer is further formed on the first edge surface of the optical layer.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1Ib is a schematic cross-sectional diagram taken along a sectional line A-A' in FIG. 1Ia.

FIG. 1Ic is a schematic cross-sectional diagram taken along a sectional line B-B' in FIG. 1Ia.

FIG. 3Db is a schematic cross-sectional diagram taken along a sectional line C-C' in FIG. 3Da.

DESCRIPTION OF THE EMBODIMENTS

Figure 1A:
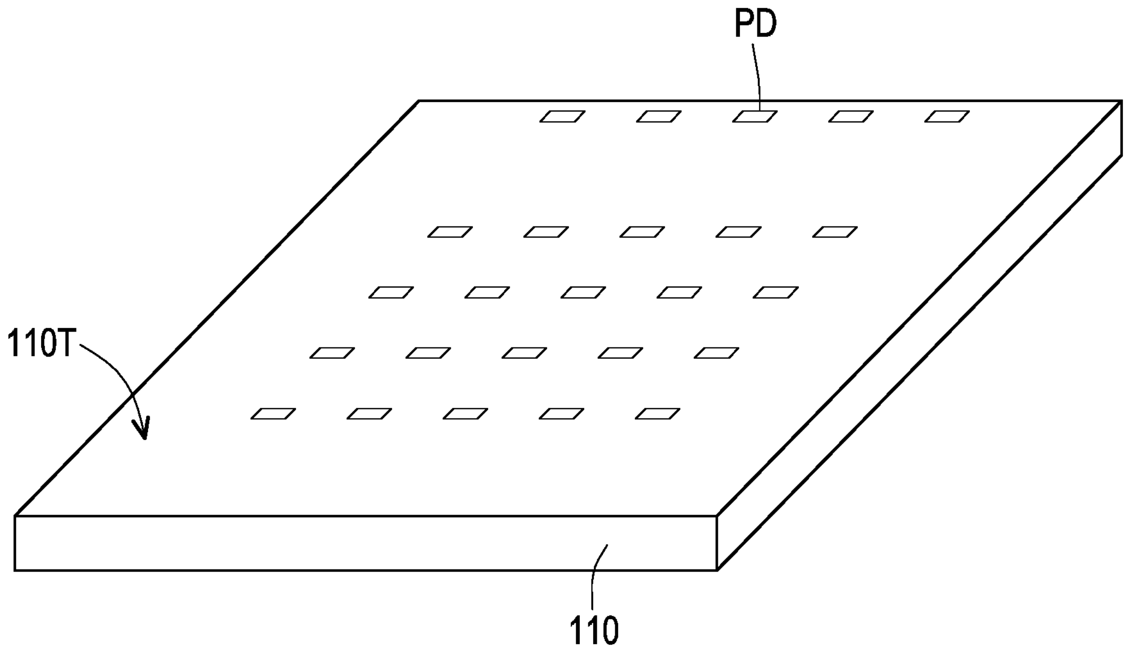
FIG. 1A to FIG. 1Ia are schematic cross-sectional diagrams illustrating steps of a manufacturing method of a display panel 10 according to an embodiment of the disclosure.

In the accompanying drawings, the thickness of layers, films, panels, regions, and so forth are enlarged for clarity. The same reference numbers refer to the same elements throughout the specification. It should be understood that when an element, such as a layer, a film, a region, or a substrate is referred to as being "on" or "connected to" another element, it can be directly on or connected to the another element, or an intermediate element may also be present. By contrast, when an element is referred to as being "directly on" or "directly connected to" another element, no intermediate element is present. As used herein, being "connected" may refer to a physical and/or electrical connection. Furthermore, being "electrically connected" or "coupled" may refer to the presence of other elements between the two elements.

It should be understood that, although the terminologies "first," "second," "third," and so forth may serve to describe various elements, components, regions, layers, and/or sections in this disclosure, these elements, components, regions, layers, and/or sections shall not be limited by these terminologies. These terminologies merely serve to distinguish one element, component, region, layer, and/or section from another element, component, region, layer, or section. Thus, a first "element," "component," "region," "layer," or "section" discussed below may be called as a second element, component, region, layer, or section without departing from the teachings herein.

The terminologies used herein are only for the purpose of describing particular embodiments and are not restrictive. As used herein, the singular forms "a," "an," and "the" are intended to include the plural forms including "at least one" or represent "and/or" unless the content clearly indicates otherwise. As used herein, the terminology "and/or" includes any and all combinations of one or more of the associated listed items. It should also be understood that when used in this disclosure, the terminologies "include" and/or "comprise" indicate the presence of the described features, regions, overall scenarios, steps, operations, elements, and/or components but do not exclude the presence or addition of one or more other features, regions, overall scenarios, steps, operations, elements, components, and/or combinations thereof.

Furthermore, relative terminologies, such as "lower" or "bottom" and "upper" or "top" may be used herein to describe the relationship between one element and another element, as shown in the drawings. It should be understood that relative terminologies are intended to encompass different orientations of the device in addition to the orientation shown in the drawings. For instance, if a device in one of the accompanying drawings is turned upside down, elements described as being on the "lower" side of other elements would then be oriented on the "upper" sides of the other elements. Thus, the exemplary terminology "lower" may include an orientation of being on the "lower" side and the "upper" side, depending on the particular orientation of the accompanying drawings. Similarly, if the device in one of the accompanying drawings is turned upside down, elements described as being "below" or "beneath" other elements would then be oriented "above" the other elements. Thus, the exemplary terminology "below" or "beneath" may encompass an orientation of being above and below.

Exemplary embodiments are described herein with reference to the cross-sectional schematic views illustrating idealized embodiments. Therefore, variations of shapes resulting from the manufacturing technologies and/or tolerances, for instance, are to be expected. Therefore, the embodiments described herein should not be construed as being limited to the particular shapes of regions as illustrated herein but are to include deviations in shapes that result from manufacturing, for instance. For instance, regions shown or described as being flat may typically have rough and/or non-linear features. Besides, the acute angle as shown may be round. Therefore, the regions shown in the drawings are schematic in nature, and their shapes are not intended to show the exact shape of the regions, and are not intended to limit the scope of the claims.

FIG. 1A to FIG. 1Ia are schematic cross-sectional diagrams illustrating steps of a manufacturing method of a display panel 10 according to an embodiment of the disclosure. With reference to FIG. 1A, a circuit substrate 110 is provided. In some embodiments, the circuit substrate 110 includes elements or circuits required by the display panel 10, such as a driving element, a switch element, a storage capacitor, a power line, a driving signal line, a timing signal line, a current compensation line, a detection signal line, and so on. In some embodiments, the circuit substrate 110 includes a switch element array. In some embodiments, the circuit substrate 110 includes a plurality of pads PD for electrically connecting the circuit substrate 110 to the outside. In some embodiments, the pads PD are disposed on a top surface 110T of the circuit substrate 110.

Figure 1B:
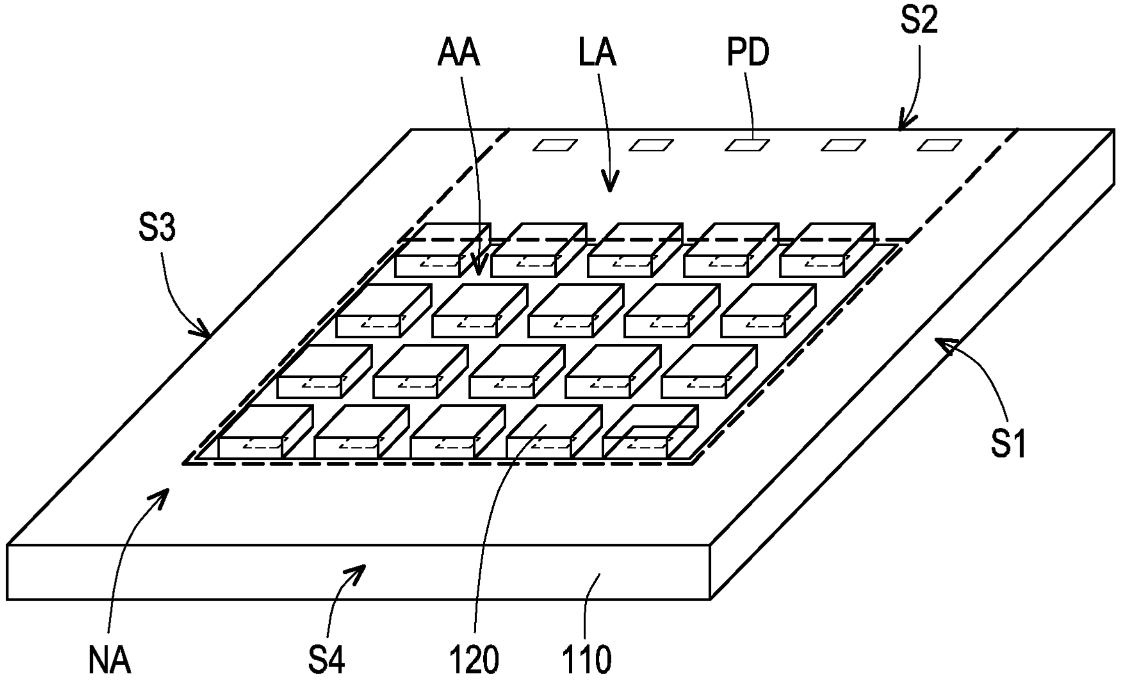

With reference to FIG. 1B, a plurality of light-emitting elements 120 are disposed on the circuit substrate 110. In some embodiments, the light-emitting elements 120 formed on a growth substrate (e.g., a sapphire substrate) may be transferred to a temporary carrier (not shown) through a mass transfer process, and the light-emitting elements 120 may be fixed onto the temporary carrier by, for instance, an adhesive material. Subsequently, pick-up bonding, direct bonding, or another method may be performed to move the light-emitting elements 120 on the temporary carrier to the circuit substrate 110. The light-emitting elements 120 may be electrically connected to the circuit substrate 110. In some embodiments, the light-emitting elements 120 may be electrically connected to the circuit substrate 110 through the pads PD on the circuit substrate 110. In some embodiments, the circuit substrate 110 has a display region AA, a peripheral region NA, and a lead out wiring region LA, and the light-emitting elements 120 are exclusively disposed at the display region AA and are not disposed at the peripheral region NA nor at the lead out wiring region LA. In some embodiments, the pads PD are located in the display region AA and the lead out wiring region LA. In some embodiments, the peripheral region NA and the lead out wiring region LA surround the display region AA. In some embodiments, the peripheral region NA adjoins a first side S1, a third side S3, and a fourth side S4 of the circuit substrate 110, and the lead out wiring region LA adjoins a second side S2 of the circuit substrate 110.

Figure 1C:
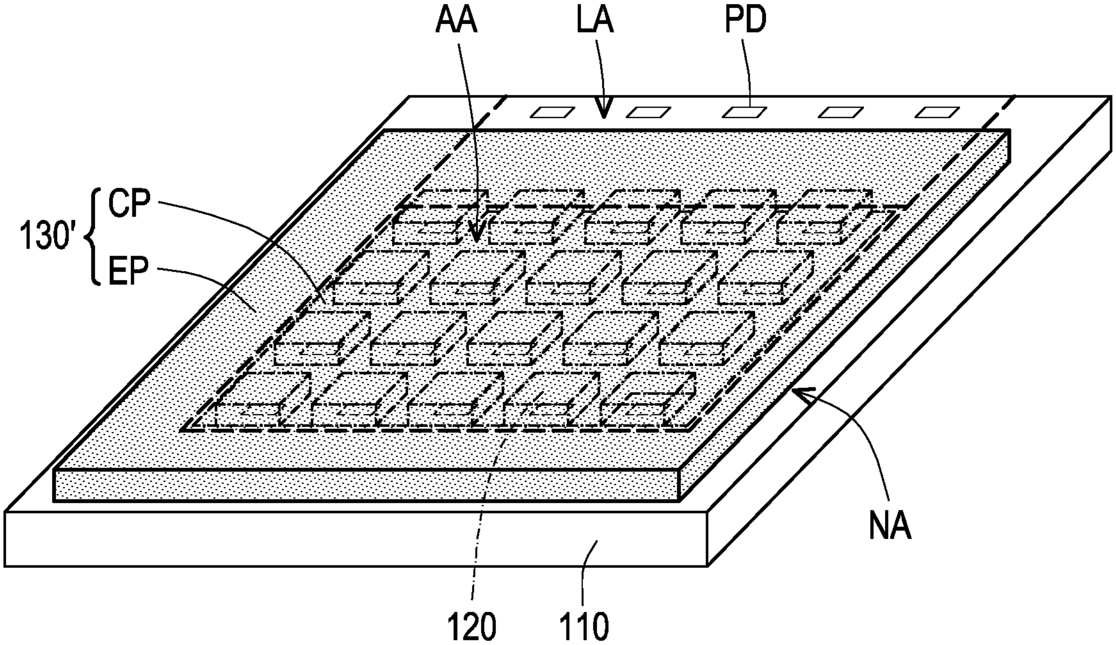

With reference to FIG. 1C, an initial encapsulation layer 130' is formed on the circuit substrate 110 and the light-emitting elements 120. The initial encapsulation layer 130' may completely cover the light-emitting elements 120. In some embodiments, the initial encapsulation layer 130' completely covers the display region AA of the circuit substrate 110, and the initial encapsulation layer 130' further covers a portion of the peripheral area NA adjacent to the display region AA. As such, an edge portion EP of the initial encapsulation layer 130', which has a relatively thin thickness due to an impact of a flow, may be located in the peripheral area NA, so that a main body portion CP of the initial encapsulation layer 130' located in the display region AA may have an improved thickness uniformity. In some embodiments, the initial encapsulation layer 130' does not extend to the lead out wiring region LA. In some embodiments, the initial encapsulation layer 130' further extends to a portion of the lead out wiring region LA adjacent to the display region AA. In some embodiments, a material of the initial encapsulation layer 130' may include an organic material, such as epoxy resin, which should however not be construed as a limitation in the disclosure.

Figure 1D:
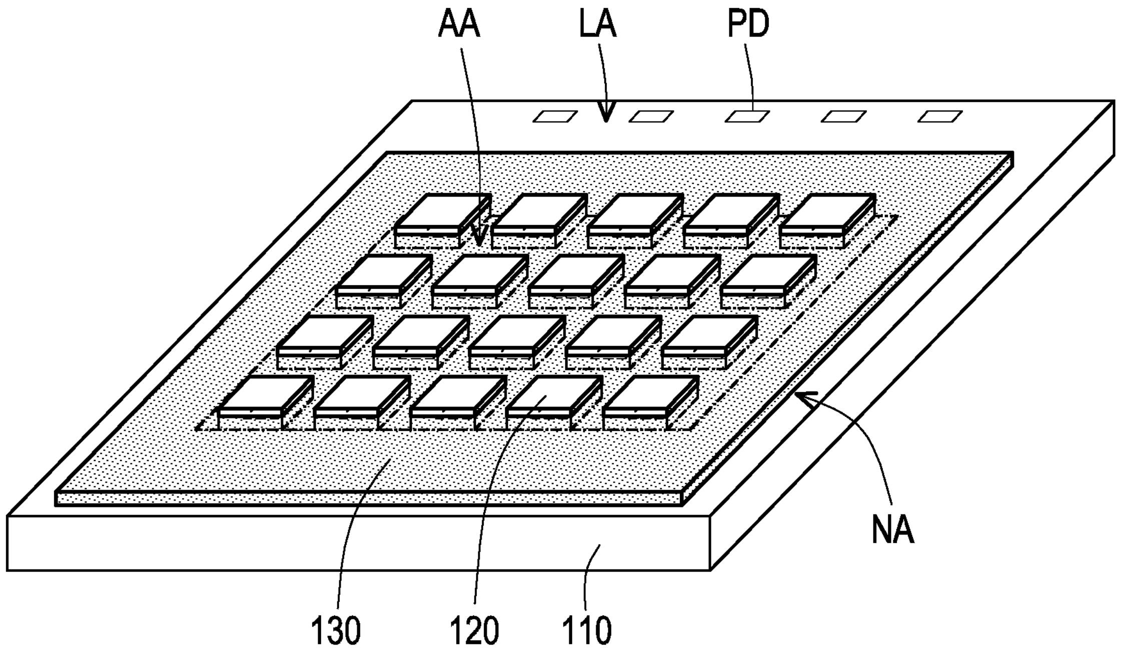

With reference to FIG. 1D, a planarization process is performed on the initial encapsulation layer 130' to expose the light-emitting elements 120 and form an encapsulation layer 130. In some embodiments, the initial encapsulation layer 130' may be planarized by plasma etching. In some embodiments, the encapsulation layer 130 includes an anti-reflection material, and a height of the encapsulation layer 130 is less than or equal to a height of the light-emitting elements 120, so as to expose light-emitting surfaces of the light-emitting elements 120. In some embodiments, the encapsulation layer 130 includes a transparent encapsulation material, and the height of the encapsulation layer 130 is greater than the height of the light-emitting elements 120, so that the encapsulation layer 130 completely covers the light-emitting elements 120.

Figure 1E:
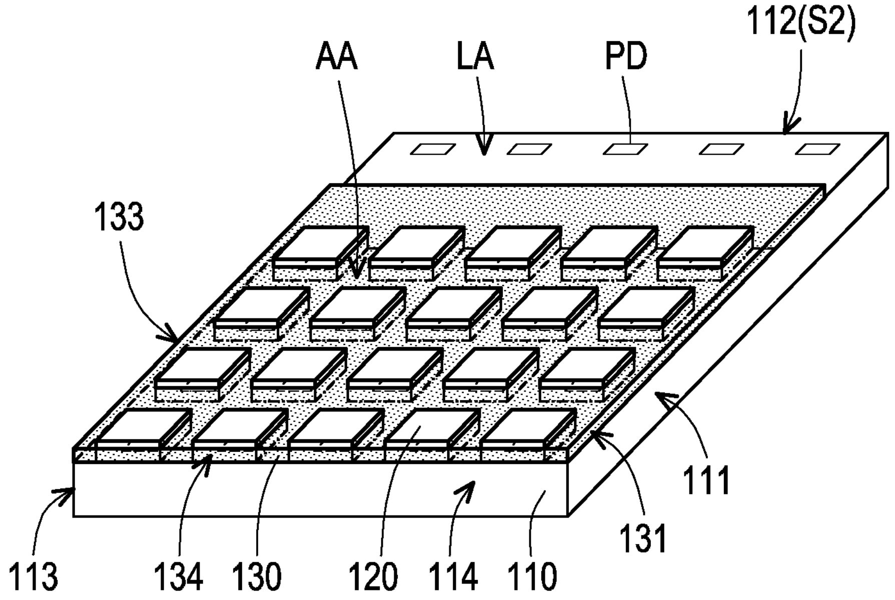

With reference to FIG. 1E, the circuit substrate 110 and the encapsulation layer 130 may be cut to remove the peripheral area NA of the circuit substrate 110 and a portion of the encapsulation layer 130 located on the peripheral area NA. After the cutting process is performed, a cutting surface of the circuit substrate 110 and a cutting surface of the encapsulation layer 130 may be exposed. For instance, the cutting surface of the circuit substrate 110 includes a first side surface 111, a third side surface 113, and a fourth side surface 114, where the first side surface 111 and the third side surface 113 extend from the display region AA to the lead out wiring region LA, and the fourth side surface 114 is located in the display region AA. The cutting surface of the encapsulation layer 130 may include a first terminal surface 131, a third terminal surface 133, and a fourth terminal surface 134, where the first terminal surface 131 and the third terminal surface 133 extend from the display region AA to the lead out wiring region LA, and the fourth terminal surface 134 is located in the display region AA. In addition, the second side surface 112 of the circuit substrate 110 disposed at the second side S2 is located in the lead out wiring region LA, and the second side surface 112 connects the first side surface 111 and the third side surface 113 of the circuit substrate 110. In some embodiments, a cutting wheel or an infrared (IR) laser may be applied to cut the circuit substrate 110. In some embodiments, an ultraviolet (UV) laser or an IR laser may be applied to cut the encapsulation layer 130.

Figure 1F:
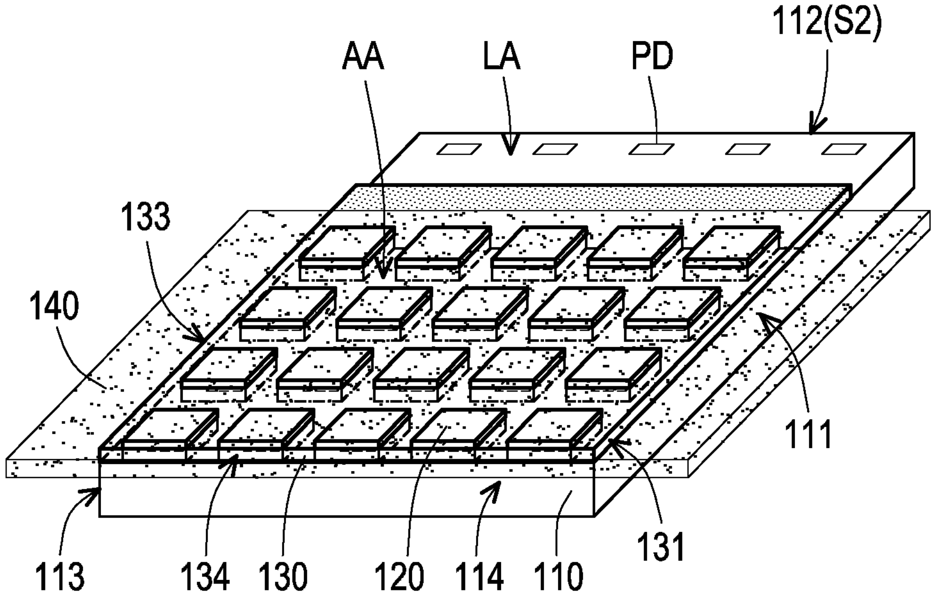

With reference to FIG. 1F, an optical layer 140 is formed on the encapsulation layer 130 and the light-emitting elements 120. In some embodiments, the optical layer 140 extends beyond the cutting surface of the circuit substrate 110 and the cutting surface of the encapsulation layer 130. For instance, the optical layer 140 extends beyond the first side surface 111, the third side surface 113, and the fourth side surface 114 of the circuit substrate 110 and the first terminal surface 131, the third terminal surface 133, and the fourth terminal surface 134 of the encapsulation layer 130, but the optical layer 140 does not extend beyond the second side surface 112 of the circuit substrate 110. In some embodiments, a portion of the optical layer 140 overlaps the lead out wiring region LA of the circuit substrate 110. In some embodiments, the optical layer 140 does not overlap the lead out wiring region LA of the circuit substrate 110.

Figure 1G:
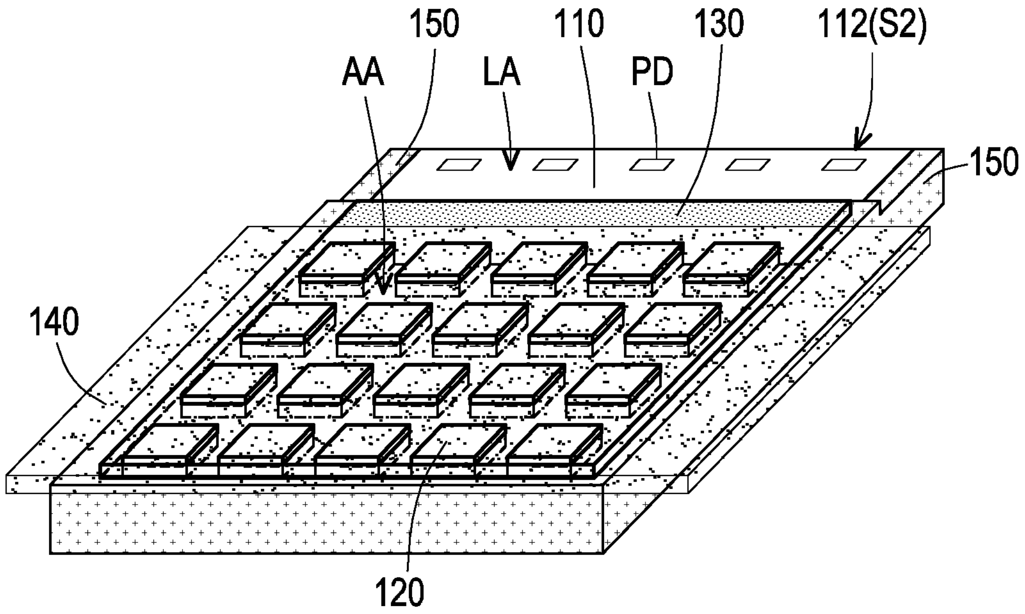

With reference to FIG. 1G, a sealing layer 150 is formed on the cutting surface of the circuit substrate 110 and the cutting surface of the encapsulation layer 130. For instance, the sealing layer 150 is formed on the first side surface 111, the third side surface 113, and the fourth side surface 114 of the circuit substrate 110 and on the first terminal surface 131, the third terminal surface 133, and the fourth terminal surface 134 of the encapsulation layer 130. In some embodiments, the sealing layer 150 is further formed on a bottom surface of the optical layer 140 facing the encapsulation layer 130. In some embodiments, the sealing layer 150 may be formed by spraying or coating.

Figure 1H:
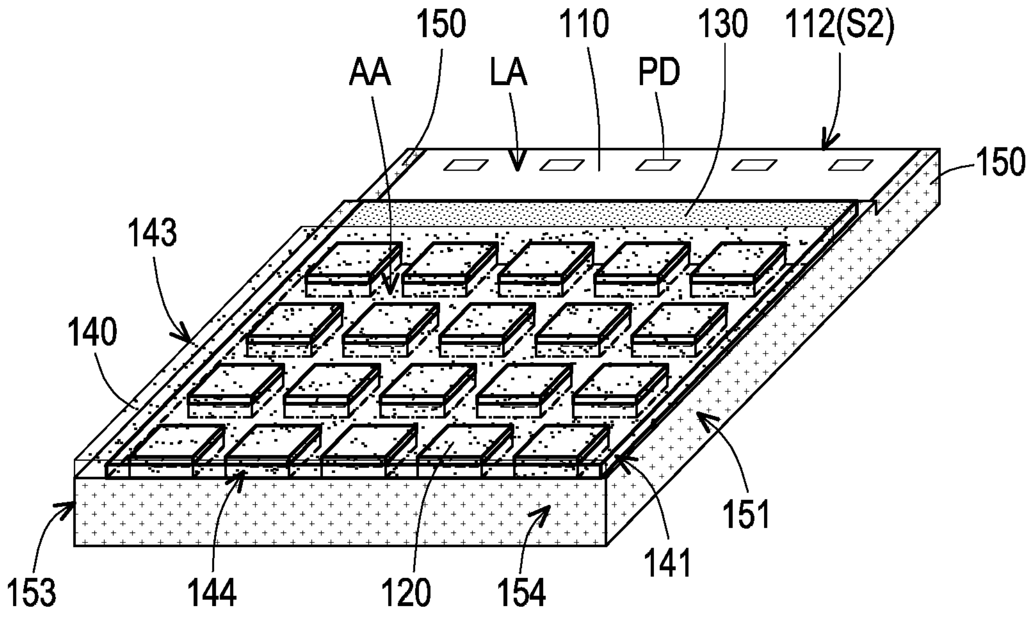

With reference to FIG. 1H, the optical layer 140 and the sealing layer 150 are cut to expose the first edge surface 141, the third edge surface 143, and the fourth edge surface 144 of the optical layer 140 and expose cutting surfaces 151, 153, and 154 of the sealing layer 150. In some embodiments, the optical layer 140 and the sealing layer 150 may be cut in one single cutting step, so that cutting marks formed by the cutting step extend continuously from the first edge surface 141 of the optical layer 140 to the cutting surface 151 of the sealing layer 150, from the third edge surface 143 of the optical layer 140 to the cutting surface 153 of the sealing layer 150, and from the fourth edge surface 144 of the optical layer 140 to the cutting surface 154 of the sealing layer 150. In some embodiments, the UV laser may be applied to cut the optical layer 140 and the sealing layer 150. Next, with reference to FIG. 1Ia, a chip bonding film CF is disposed at the lead out wiring region LA. In some embodiments, the chip bonding film CF is electrically connected to the pads PD.

Figure 1I:
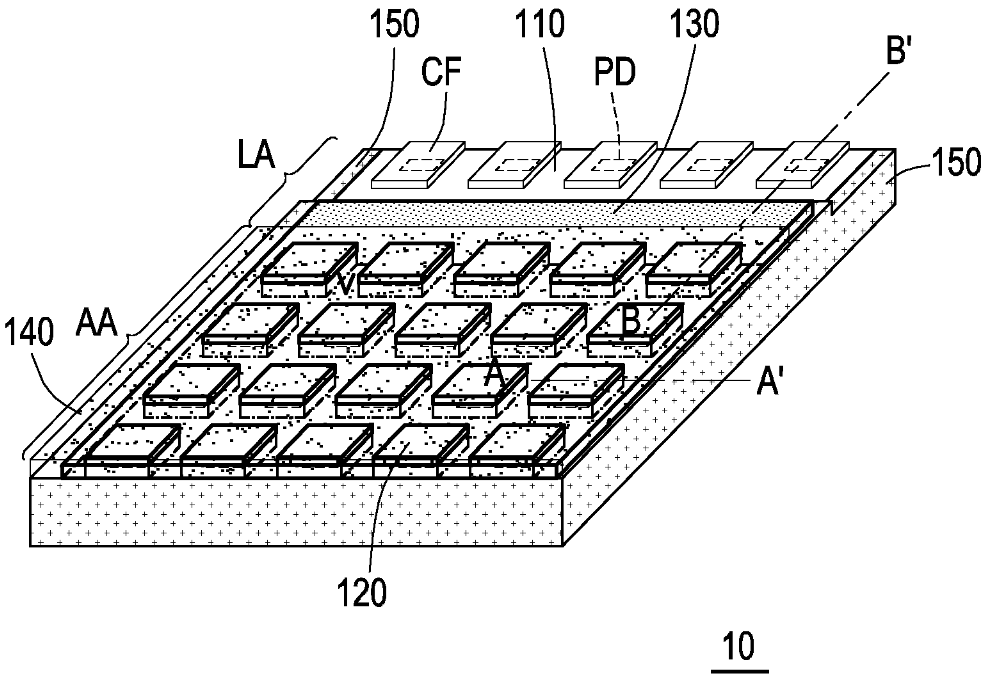
Figure 1I:
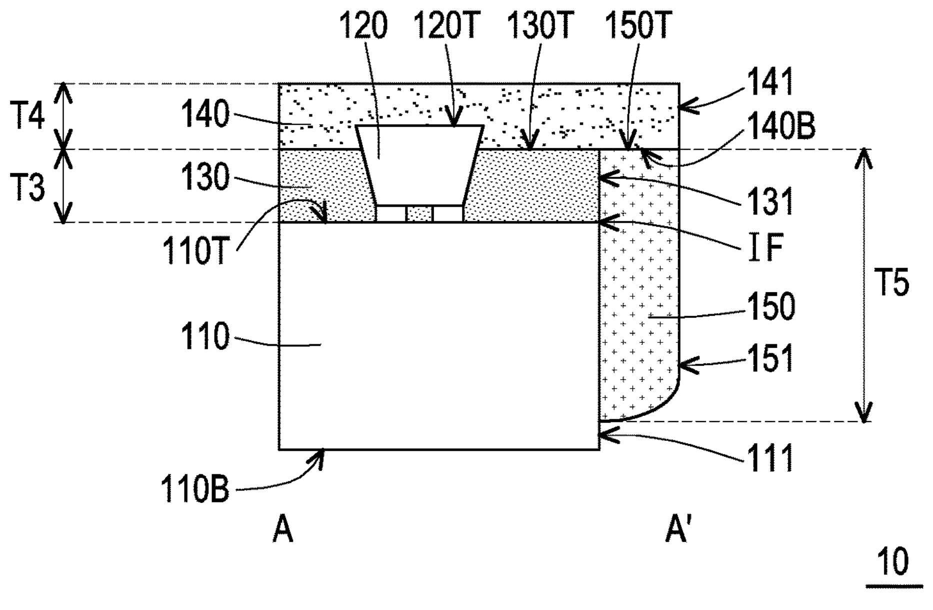
Figure 1I:
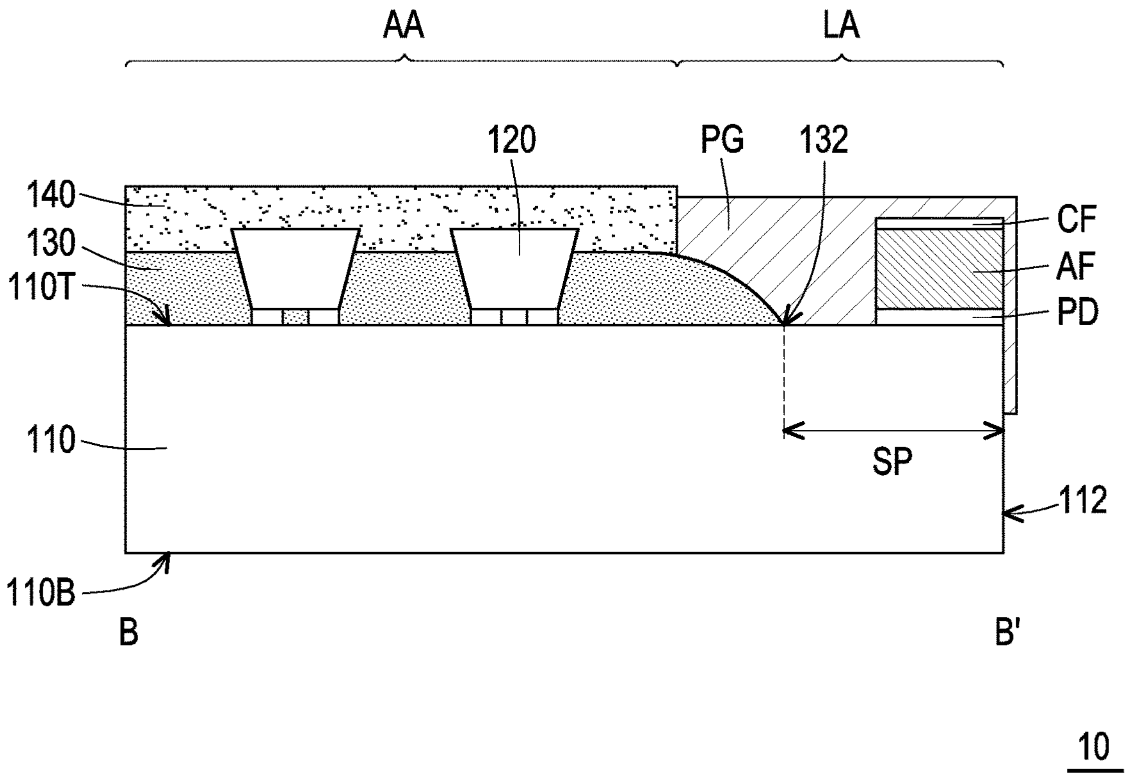

FIG. 1Ia is a schematic three-dimensional diagram illustrating the display panel 10 according to an embodiment of the disclosure. FIG. 1Ib is a schematic cross-sectional diagram taken along a sectional line A-A' in FIG. 1Ia. FIG. 1Ic is a schematic cross-sectional diagram taken along a sectional line B-B' in FIG. 1Ia.

With reference to FIG. 1Ia to FIG. 1Ic, the display panel 10 may have the display region AA and the lead out wiring region LA adjacent to each other and includes the circuit substrate 110, the light-emitting elements 120, the encapsulation layer 130, and the sealing layer 150. The light-emitting elements 120 may be disposed on the circuit substrate 110, and the light-emitting elements 120 are disposed at the display region AA. In some embodiments, the circuit substrate 110 has the top surface 110T, a bottom surface 110B opposite thereto, and the adjacent first side surface 111 and second side surface 112, the first side surface 111 connects the top surface 110T and the bottom surface 110B, and the second side surface 112 also connects the top surface 110T and the bottom surface 110B. The light-emitting elements 120 may be disposed at the top surface 110T of the circuit substrate 110.

In some embodiments, the encapsulation layer 130 is disposed at the display region AA, and the encapsulation layer 130 is located on the top surface 110T of the circuit substrate 110 and between the light-emitting elements 120. In some embodiments, the encapsulation layer 130 is exclusively disposed at the display region AA. In some embodiments, the encapsulation layer 130 further extends to the lead out wiring region LA. In some embodiments, the first terminal surface 131 of the encapsulation layer 130 is substantially aligned with the first side surface 111 of the circuit substrate 110.

In some embodiments, the display panel 10 is an opaque display panel, and the encapsulation layer 130 includes an anti-reflection material, such as a black light-absorbing material. In some embodiments, a horizontal height of a top surface 130T of the encapsulation layer 130 is less than or equal to a horizontal height of a surface 120T of the light-emitting elements 120. In other words, the encapsulation layer 130 at least exposes the light-emitting surfaces of the light-emitting elements 120. In some embodiments, when a thickness T3 of the encapsulation layer 130 is approximately 5 μm to 10 μm, an optical density (OD) value or a light blocking value of the encapsulation layer 130 is greater than or equal to 3.

In some embodiments, the sealing layer 150 covers the first side surface 111 of the circuit substrate 110 and the first terminal surface 131 of the encapsulation layer 130. In some embodiments, the sealing layer 150 continuously extends from the first side surface 111 of the circuit substrate 110 to the first terminal surface 131 of the encapsulation layer 130. As such, the sealing layer 150 may seal an interface IF between the encapsulation layer 130 and the circuit substrate 110, thereby preventing the interface IF from peeling off due to a high temperature and high humidity environment and improving the reliability of the display panel 10. In some embodiments, a thickness T5 of the sealing layer 150 is about 150 μm to 500 μm. In some embodiments, when the thickness of the sealing layer 150 is about 150 μm to 500 μm, an OD value of the sealing layer 150 is greater than or equal to 2.

With reference to FIG. 1Ia and FIG. 1Ic, in some embodiments, the display panel 10 further includes pads PD located in the lead out wiring region LA. In some embodiments, the display panel 10 further includes chip bonding films CF, and the chip bonding films CF are electrically connected to the pads PD. In some embodiments, pins of the chip bonding films CF are electrically connected to the pads PD through a conductive adhesive AF (e.g., an anisotropic conductive adhesive). In some embodiments, the display panel 10 further includes a protection adhesive PG that is located at the lead out wiring region LA and covers the chip bonding films CF. In some embodiments, a material of the protection adhesive PG is different from a material of the encapsulation layer 130. In some embodiments, the protection adhesive PG further extends to the second side surface 112 of the circuit substrate 110.

In some embodiments, the second terminal surface 132 of the encapsulation layer 130 is located between the light-emitting elements 120 and the second side surface 112 of the circuit substrate 110. In some embodiments, the second terminal surface 132 of the encapsulation layer 130 is located at the lead out wiring region LA. In some embodiments, there is a pitch SP between the second terminal surface 132 of the encapsulation layer 130 and the second side surface 112 of the circuit substrate 110. In some embodiments, the pads PD are disposed between the second terminal surface 132 of the encapsulation layer 130 and the second side surface 112 of the circuit substrate 110.

With reference to FIG. 1Ia and FIG. 1Ib, in some embodiments, the display panel 10 further includes the optical layer 140 that is disposed at the display region AA and located on the light-emitting elements 120 and the encapsulation layer 130. In some embodiments, the first edge surface 141 of the optical layer 140 extends beyond the first terminal surface 131 of the encapsulation layer 130, and the optical layer 140 is further located on the sealing layer 150. In other words, the sealing layer 150 may physically contact the first terminal surface 131 of the encapsulation layer 130 and a bottom surface 140B of the optical layer 140. In some embodiments, the top surface 130T of the encapsulation layer 130 is aligned with the surface 150T of the sealing layer 150. In some embodiments, the cutting marks on the first edge surface 141 of the optical layer 140 continuously extend to the cutting surface 151 of the sealing layer 150. In some embodiments, the optical layer 140 includes a plurality of film layers. In some embodiments, a thickness T4 of the optical layer 140 is approximately 100 μm to 150 μm. In some embodiments, the display panel 10 further includes an adhesive layer (not shown) located between the light-emitting elements 120 and the encapsulation layer 130 and the optical layer 140, and the adhesive layer is, for instance, an acrylic adhesive layer.

Other embodiments provided in the disclosure are described below with reference to FIG. 2 to FIG. 6, and reference numbers of the elements and a part of contents of the embodiments depicted in FIG. 1A to FIG. 1Ic are also used in the following embodiments, where the same reference numbers denote the same or like elements, and descriptions of the same technical contents are omitted. The previous embodiments depicted in FIG. 1A to FIG. 1Ic may be referred to for descriptions of the omitted parts, and detailed descriptions thereof are not repeated in the following embodiments.

Figure 2:
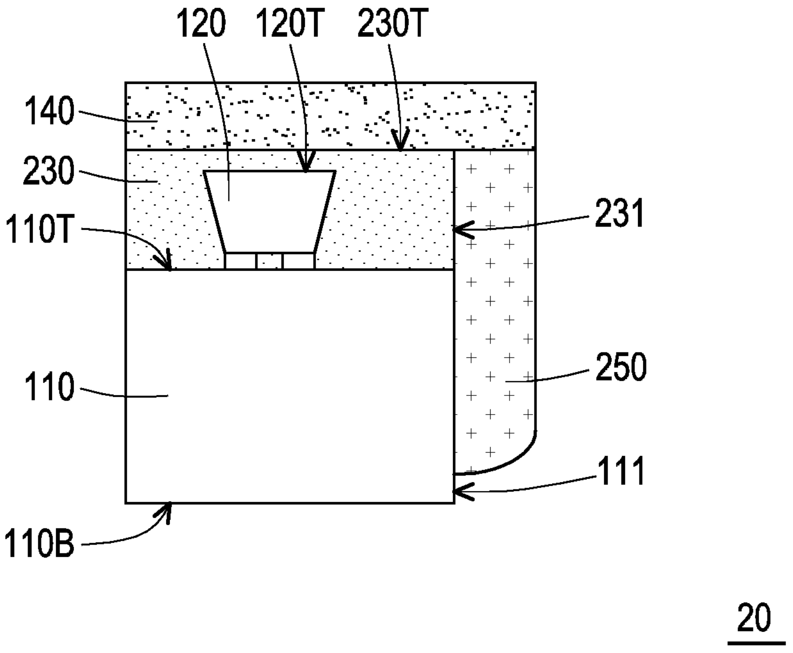
FIG. 2 is a schematic cross-sectional diagram illustrating a display panel 20 according to an embodiment of the disclosure.

FIG. 2 is a schematic cross-sectional diagram illustrating a display panel 20 according to an embodiment of the disclosure. The display panel 20 includes the circuit substrate 110, the light-emitting elements 120, an encapsulation layer 230, the optical layer 140, and a sealing layer 250.

In comparison, the display panel 10 shown in FIG. 1Ia to FIG. 1Ic and the display panel 20 shown in FIG. 2 are different, and the difference lies in that the display panel 20 is a transparent display panel, and that the encapsulation layer 230 of the display panel 20 may include a transparent encapsulation adhesive. In some embodiments, a horizontal height of the top surface 230T of the encapsulation layer 230 is greater than the horizontal height of the top surface 120T of the light-emitting elements 120. In other words, the encapsulation layer 230 may completely cover the light-emitting elements 120. In some embodiments, a transmittance of the encapsulation layer 230 is greater than or equal to 80%. In some embodiments, a thickness of the encapsulation layer 230 is about 10 μm to 50 μm. In some embodiments, the sealing layer 250 includes a transparent sealing adhesive. In some embodiments, a transmittance of the sealing layer 250 is greater than or equal to 80%. In addition, the sealing layer 250 may cover a first terminal surface 231 of the encapsulation layer 230 and the first side surface 111 of the circuit substrate 110.

FIG. 3A to FIG. 3Da are schematic cross-sectional diagrams illustrating steps of a manufacturing method of a display panel 30 according to an embodiment of the disclosure. The steps depicted in FIG. 3A to FIG. 3Da may be carried out following the steps depicted in FIG. 1A to FIG. 1D.

Figure 3A:
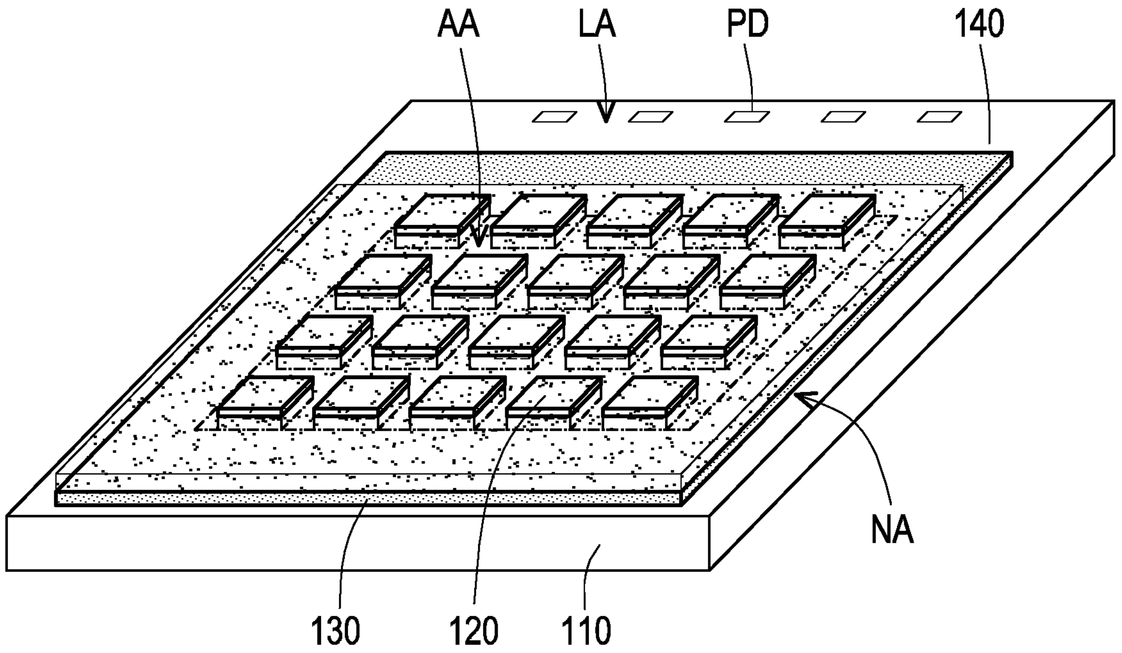
FIG. 3A to FIG. 3Da are schematic cross-sectional diagrams illustrating steps of a manufacturing method of a display panel 30 according to an embodiment of the disclosure.

With reference to FIG. 3A, after the encapsulation layer 130 is formed on the circuit substrate 110 and between the light-emitting elements 120, the optical layer 140 may be formed on the encapsulation layer 130 and the light-emitting elements 120. In some embodiments, the optical layer 140 at least completely covers the light-emitting elements 120. In some embodiments, the optical layer 140 completely covers the encapsulation layer 130.

Figure 3B:
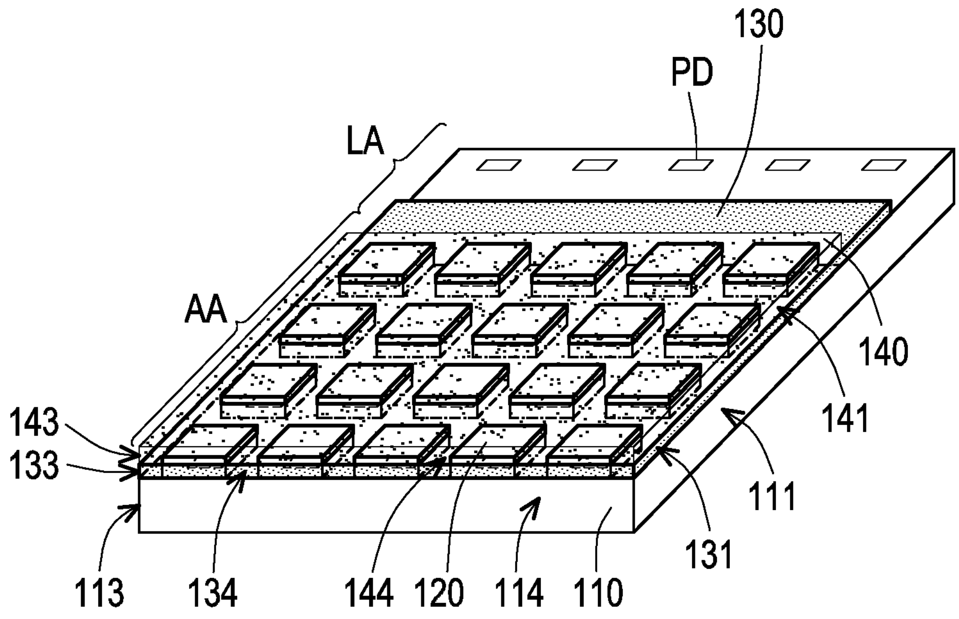
Figure 3C:
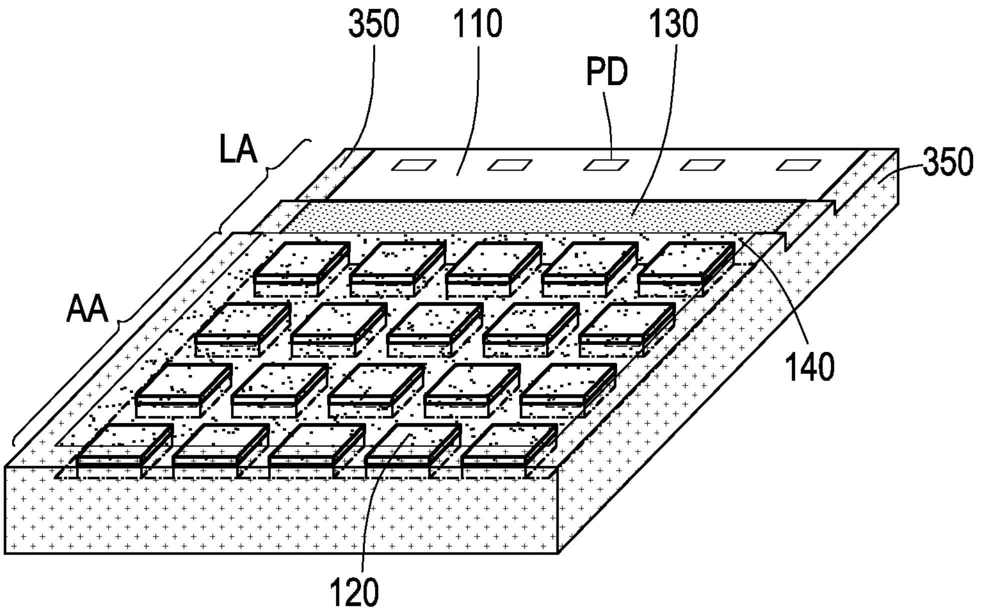
Figure 3D:
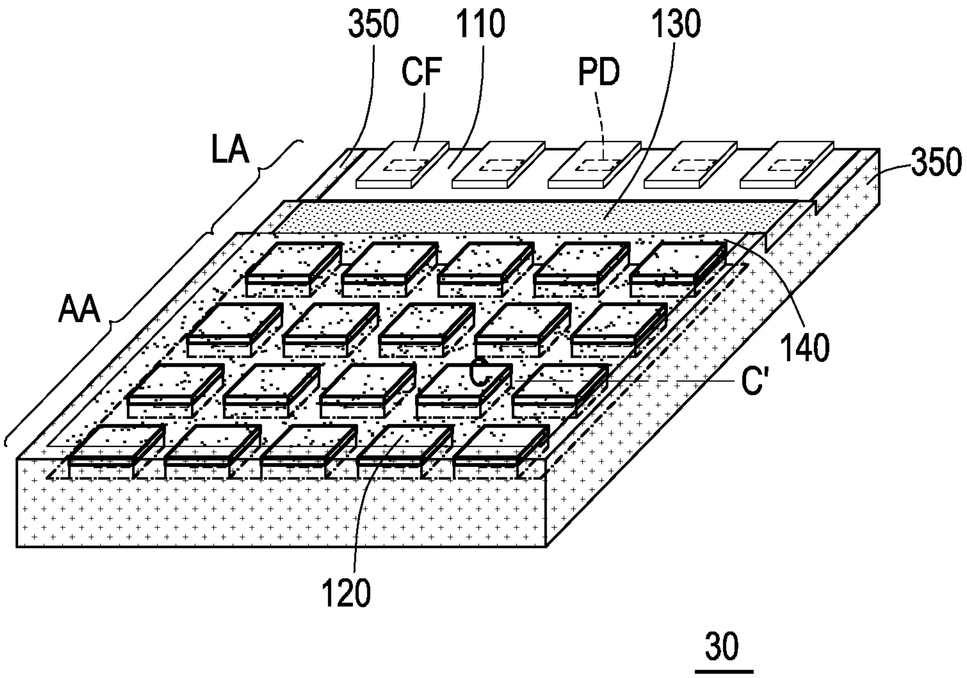
Figure 3D:
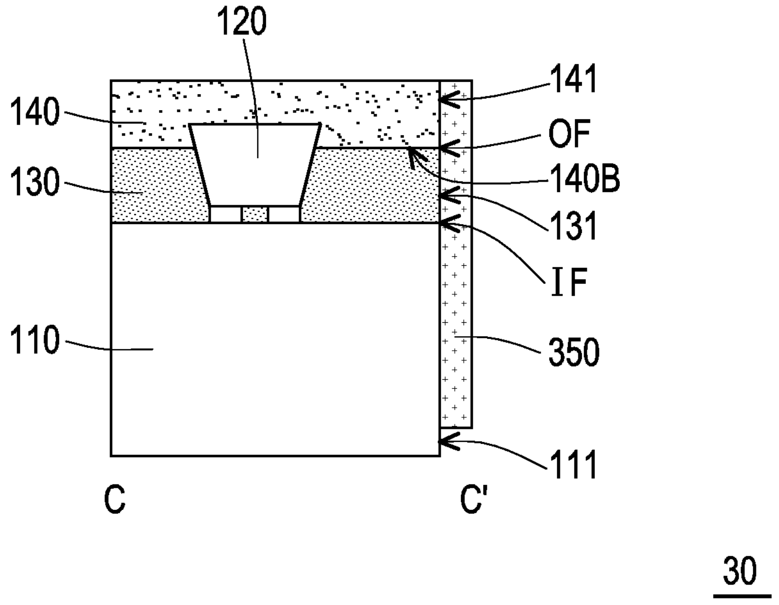

With reference to FIG. 3B, after the optical layer 140, the encapsulation layer 130, and the circuit substrate 110 are cut, the display region AA where the light-emitting elements 120 are disposed and the lead out wiring region LA where the pads PD are disposed are left, and the cutting surfaces of the optical layer 140, the encapsulation layer 130, and the circuit substrate 110 are exposed. For instance, after the cutting process is performed, the first edge surface 141, the third edge surface 143, and the fourth edge surface 144 of the optical layer 140, the first terminal surface 131, the third terminal surface 133, and the fourth terminal surface 134 of the encapsulation layer 130, and the first side surface 111, the third side surface 113, and the fourth side surface 114 of the circuit substrate 110 are exposed. In some embodiments, a laser may be applied to cut the optical layer 140, the encapsulation layer 130, and the circuit substrate 110. In some embodiments, a UV laser may be applied to cut the optical layer 140 and the encapsulation layer 130, and an IR laser may be applied to cut the circuit substrate 110. With reference to FIG. 3B to FIG. 3C, a sealing layer 350 is formed on the cutting surfaces of the optical layer 140, the encapsulation layer 130, and the circuit substrate 110. For instance, the sealing layer 350 may be formed on the first edge surface 141, the third edge surface 143, and the fourth edge surface 144 of the optical layer 140, the first terminal surface 131, the third terminal surface 133, and the fourth terminal surface 134 of the encapsulation layer 130, and the first side surface 111, the third side surface 113, and the fourth side surface 114 of the circuit substrate 110. With reference to FIG. 3Da, the chip bonding films CF are disposed at the lead out wiring region LA, and the chip bonding films CF are electrically connected to the pads PD, thereby completing the fabrication of the display panel 30.

FIG. 3Da is a schematic three-dimensional diagram illustrating the display panel 30 according to an embodiment of the disclosure. FIG. 3Db is a schematic cross-sectional diagram taken along a sectional line C-C' in FIG. 3Da. With reference to FIG. 3Da and FIG. 3Db, the display panel 30 includes the circuit substrate 110, the light-emitting elements 120, the encapsulation layer 130, the optical layer 140, and a sealing layer 350.

In comparison, the display panel 10 shown in FIG. 1Ia to FIG. 1Ic and the display panel 30 shown in FIG. 3Da to FIG. 3Db are different, and the difference lies in that the first edge surface 141 of the optical layer 140 is aligned with the first terminal surface 131 of the encapsulation layer 130, and the sealing layer 350 covers the first edge surface 141 of the optical layer 140, the first terminal surface 131 of the encapsulation layer 130, and the first side surface 111 of the circuit substrate 110. As such, the sealing layer 350 may prevent an interface OF between the optical layer 140 and the encapsulation layer 130 and the interface IF between the encapsulation layer 130 and the circuit substrate 110 from peeling off, thereby improving the reliability of the display panel 30.

Figure 4:
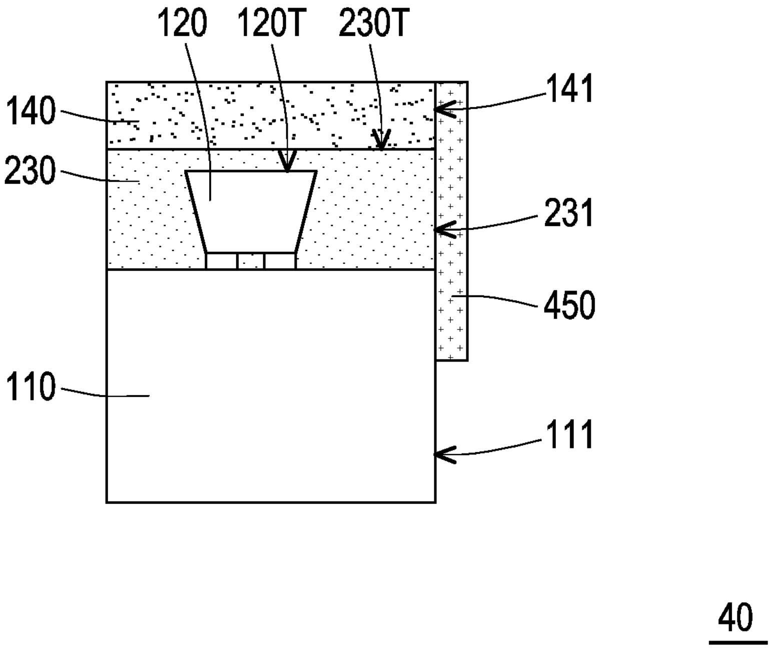
FIG. 4 is a schematic cross-sectional diagram illustrating a display panel 40 according to an embodiment of the disclosure.

FIG. 4 is a schematic cross-sectional diagram illustrating a display panel 40 according to an embodiment of the disclosure. The display panel 40 includes the circuit substrate 110, the light-emitting elements 120, the encapsulation layer 230, the optical layer 140, and a sealing layer 450.

In comparison, the display panel 30 shown in FIG. 3Da to FIG. 3Db and the display panel 40 shown in FIG. 4 are different, and the difference lies in that the display panel 40 is a transparent display panel, and that the encapsulation layer 230 of the display panel 40 includes a transparent encapsulation material. In some embodiments, the horizontal height of the top surface 230T of the encapsulation layer 230 is greater than the horizontal height of the top surface 120T of the light-emitting elements 120. In other words, the encapsulation layer 230 may completely cover the light-emitting elements 120. In some embodiments, the transmittance of the encapsulation layer 230 is greater than or equal to 80%. In some embodiments, the thickness of the encapsulation layer 230 is about 10 μm to 50 μm. The sealing layer 450 may cover the first edge surface 141 of the optical layer 140, the first terminal surface 231 of the encapsulation layer 230, and the first side surface 111 of the circuit substrate 110. In some embodiments, the sealing layer 450 includes a transparent sealing material. In some embodiments, the transmittance of the sealing layer 450 is greater than or equal to 80%.

Figure 5A:
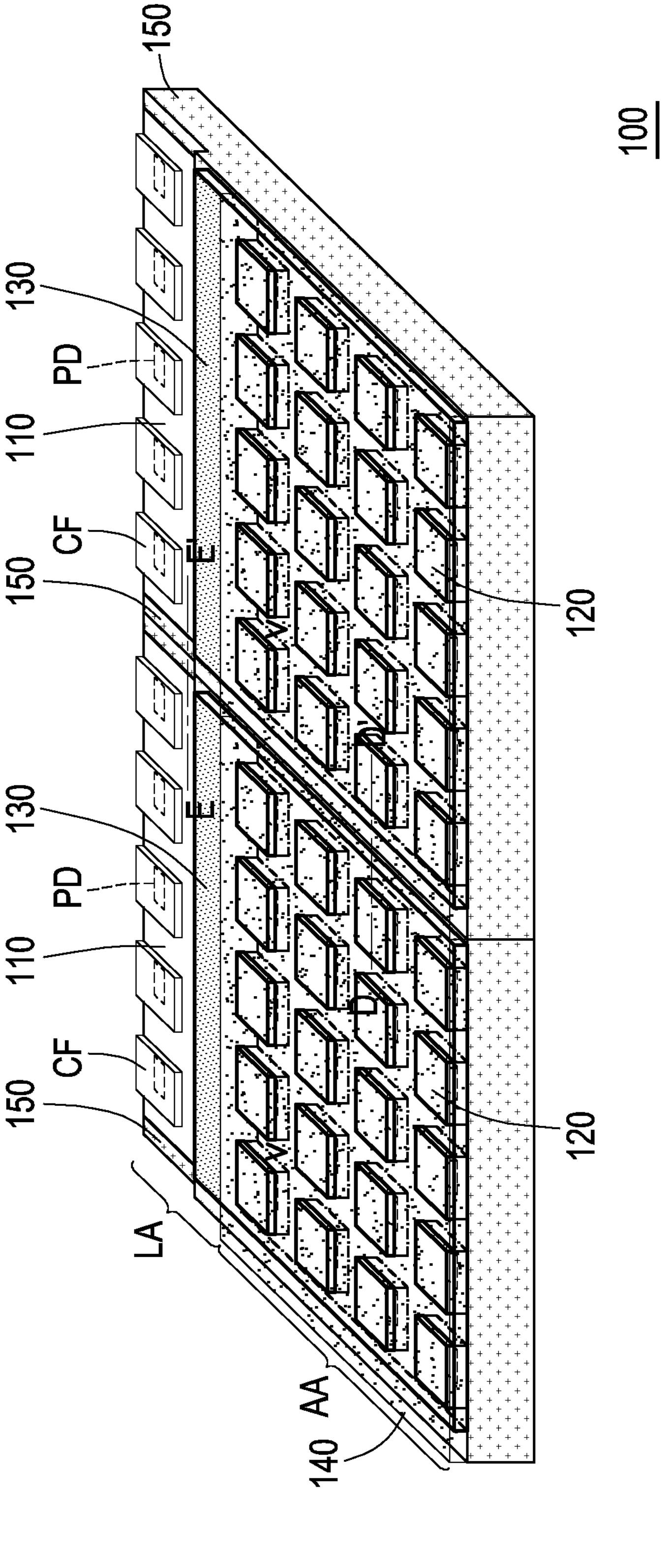
FIG. 5A is a schematic three-dimensional diagram illustrating a tiled display device 100 according to an embodiment of the disclosure.
Figure 5B:
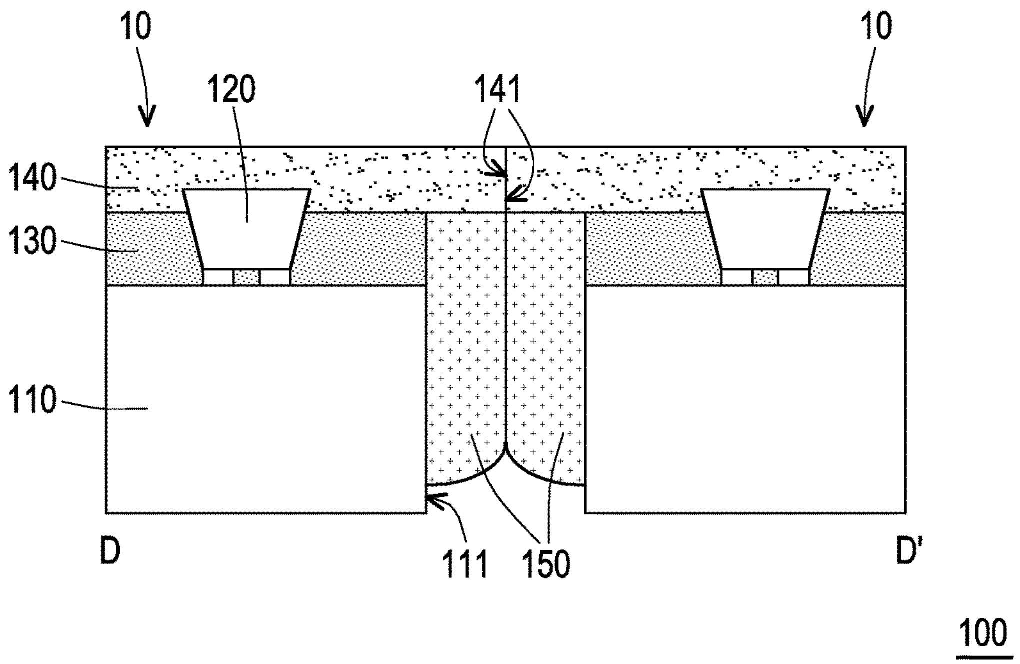
FIG. 5B is a schematic cross-sectional diagram taken along a sectional line D-D' in FIG. 5A.
Figure 5C:
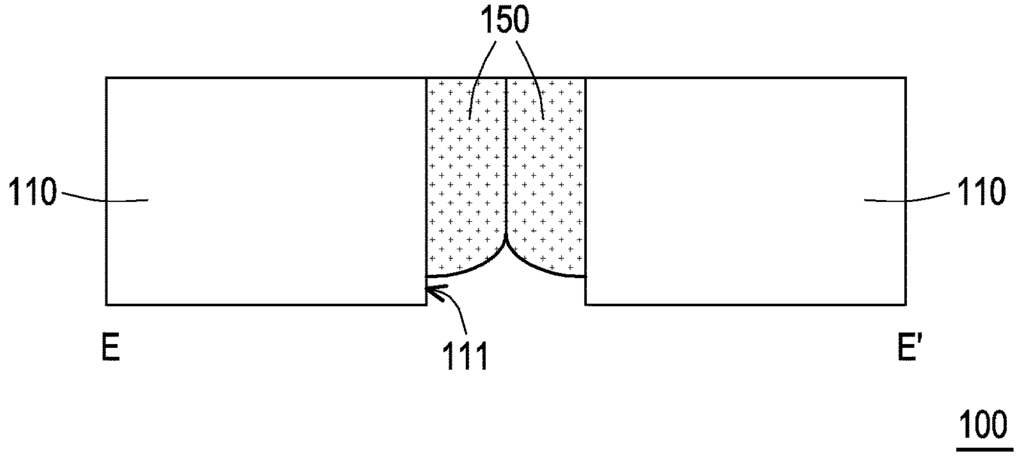
FIG. 5C is a schematic cross-sectional diagram taken along a sectional line E-E' in FIG. 5A.

FIG. 5A is a schematic three-dimensional diagram illustrating a tiled display device 100 according to an embodiment of the disclosure. FIG. 5B is a schematic cross-sectional diagram taken along a sectional line D-D' in FIG. 5A. FIG. 5C is a schematic cross-sectional diagram taken along a sectional line E-E' in FIG. 5A. With reference to FIG. 5A, the tiled display device 100 includes two of the above-mentioned display panels 10.

With reference to FIG. 5B, in some embodiments, the first side surface 111 of the circuit substrate 110 of the left display panel 10 faces the first side surface 111 of the circuit substrate 110 of the right display panel 10. In some embodiments, the sealing layers 150 of the two display panels 10 are located between the two display panels 10. In some embodiments, the first edge surfaces 141 of the optical layers 140 of the two display panels 10 substantially physically contact each other, thus enabling seamless tiling of the optical layers 140 of the two display panels 10.

With reference to FIG. 5A and FIG. 5C, in some embodiments, the sealing layer 150 further extends from one portion of the first side surface 111 located in the display region AA to the other portion of the first side surface 111 located in the lead out wiring region LA, and in the lead out wiring region LA, the sealing layer 150 is sandwiched between the two circuit substrates 110. In some embodiments, the tiled display device 100 includes two of the above-mentioned display panels 20.

Figure 6:
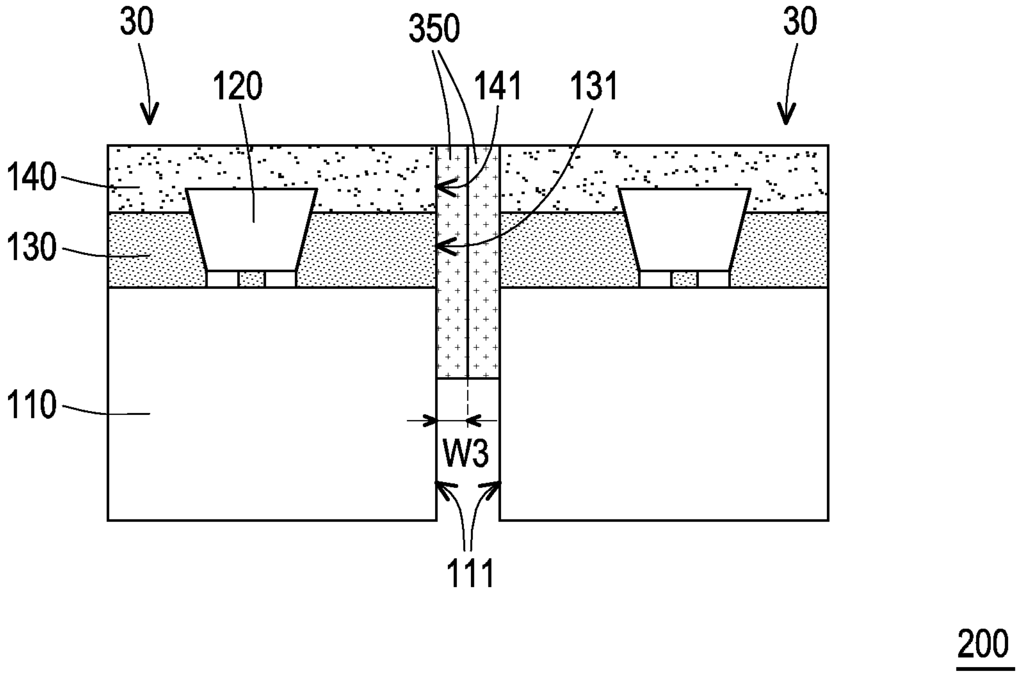
FIG. 6 is a schematic three-dimensional diagram illustrating a tiled display device 200 according to an embodiment of the disclosure.

FIG. 6 is a schematic three-dimensional diagram illustrating a tiled display device 200 according to an embodiment of the disclosure. In comparison, the tiled display device 100 shown in FIG. 5A to FIG. 5C and the tiled display device 200 shown in FIG. 6 are different, and the difference lies in that the tiled display device 200 includes two of the above-mentioned display panels 30.

In some embodiments, the first side surface 111 of the circuit substrate 110 of the left display panel 30 adjoins the first side surface 111 of the circuit substrate 110 of the right display panel 30. In some embodiments, the sealing layers 350 of the two display panels 30 are sandwiched between the optical layers 140, the encapsulation layers 130, and the circuit substrates 110 of the two display panels 30, thus enabling seamless tiling of the two display panels 30. A width W3 of the sealing layer 350 is not particularly limited as long as the pitch between the light-emitting elements 120 on both sides of the sealing layer 350 is roughly equal to the pitch between the two adjacent light-emitting elements 120 in each display panel 30. In some embodiments, the width W3 of the sealing layer 350 is about 30 μm to 100 μm. In some embodiments, the tiled display device 200 includes two of the above-mentioned display panels 40.

To sum up, in the display panel provided in one or more embodiments of the disclosure, the interface between the encapsulation layer and the circuit substrate is sealed by the sealing layer, thus preventing the interface from peeling off in the high temperature and high humidity environment and further improving the reliability of the display panel. In addition, according to the manufacturing method of the display panel provided in one or more embodiments of the disclosure, the thickness uniformity of the encapsulation layer in the display region is improved by applying the initial encapsulation layer to the display region and the peripheral region and then performing the cutting process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, having a display region and a lead out wiring region adjacent to the display region and comprising:

a circuit substrate, having a top surface, a bottom surface opposite to the top surface, and a first side surface connecting the top surface and the bottom surface, wherein the first side surface extends from a side of the display region to a side of the lead out wiring region;

a plurality of light-emitting elements, disposed at the display region and located on the circuit substrate;

an encapsulation layer, disposed at the display region and located on the circuit substrate and between the light-emitting elements, wherein a first terminal surface of the encapsulation layer is aligned with the first side surface of the circuit substrate;

a sealing layer, covering the first side surface of the circuit substrate and the first terminal surface of the encapsulation layer;

a chip bonding film disposed at the lead out wiring region, wherein a pin of the chip bonding film is electrically connected to the circuit substrate; and a protection adhesive located in the lead out wiring region and covering the chip bonding film.

2. The display panel as claimed in claim 1, wherein a height of the encapsulation layer is less than or equal to a height of the light-emitting elements.

3. The display panel as claimed in claim 2, wherein a thickness of the encapsulation layer is 5 μm to 10 μm, an optical density value of the encapsulation layer is greater than or equal to 3.

4. The display panel as claimed in claim 1, wherein a height of the encapsulation layer is greater than a height of the light-emitting elements.

5. The display panel as claimed in claim 4, wherein a transmittance of the encapsulation layer is greater than or equal to 80%, and a transmittance of the sealing layer is greater than or equal to 80%.

6. The display panel as claimed in claim 1, wherein the sealing layer extends from one portion of the first side surface of the circuit substrate located in the display region to the other portion of the first side surface of the circuit substrate located in the lead out wiring region.

7. The display panel as claimed in claim 1, wherein a material of the protection adhesive is different from a material of the encapsulation layer.

8. The display panel as claimed in claim 1, wherein the protection adhesive covers a second side surface of the circuit substrate located in the lead out wiring region, and the second side surface adjoins the first side surface of the circuit substrate.

9. The display panel as claimed in claim 8, wherein a second terminal surface of the encapsulation layer is located between the light-emitting elements and the second side surface.

10. The display panel as claimed in claim 9, wherein the chip bonding film is located between the second terminal surface and the second side surface.

11. The display panel as claimed in claim 1, further comprising an optical layer disposed at the display region and located on the light-emitting elements and the encapsulation layer.

12. The display panel as claimed in claim 11, wherein a first edge surface of the optical layer extends beyond the first terminal surface of the encapsulation layer, and the sealing layer physically contacts the encapsulation layer and the optical layer.

13. The display panel as claimed in claim 12, wherein a cutting mark on the first edge surface of the optical layer continuously extends to a cutting surface of the sealing layer.

14. The display panel as claimed in claim 12, wherein a top surface of the encapsulation layer is aligned with a top surface of the sealing layer.

15. The display panel as claimed in claim 11, wherein a first edge surface of the optical layer is aligned with the first terminal surface of the encapsulation layer, and the sealing layer further covers the first edge surface of the optical layer.

16. A tiled display device, comprising:

two display panels as claimed in claim 1.

17. The tiled display device as claimed in claim 16, wherein the first side surfaces of the circuit substrates of the two display panels are opposite to each other.

18. The tiled display device as claimed in claim 16, wherein the sealing layer is located between the two display panels.

* * * * *